US008619639B2

(12) United States Patent
Mertens et al.

(10) Patent No.: US 8,619,639 B2
(45) Date of Patent: Dec. 31, 2013

(54) POWER DETECTOR RADIO FREQUENCY MULTIPLEXER

(75) Inventors: Koen Mertens, Villach (AT); Andreas Wiesbauer, Portschach (AT); Sven Derksen, Villach (AT); Marc Tiebout, Finkenstein (AT)

(73) Assignee: Lantiq Deutschland GmbH, Neubiberg (DE)

( * ) Notice: Subject to any disclaimer, the term of this patent is extended or adjusted under 35 U.S.C. 154(b) by 1234 days.

(21) Appl. No.: 11/774,432

(22) Filed: Jul. 6, 2007

(65) Prior Publication Data
US 2009/0011734 A1    Jan. 8, 2009

(51) Int. Cl.
*H04B 7/00* (2006.01)
(52) U.S. Cl.
USPC ........... 370/277; 370/310; 370/465; 455/101; 455/127.1; 455/232.1
(58) Field of Classification Search
None
See application file for complete search history.

(56) References Cited

U.S. PATENT DOCUMENTS

| | | | | |
|---|---|---|---|---|
| 4,704,734 A * | 11/1987 | Menich et al. | ................ | 455/440 |
| 6,041,000 A * | 3/2000 | McClure et al. | ............... | 365/200 |
| 6,108,527 A * | 8/2000 | Urban et al. | ............... | 455/115.3 |
| 6,173,160 B1 * | 1/2001 | Liimatainen | ............... | 455/67.11 |
| 6,192,030 B1 * | 2/2001 | Anbe | ............... | 370/229 |
| 6,337,975 B1 * | 1/2002 | Coan et al. | ............... | 455/129 |
| 6,374,116 B1 * | 4/2002 | Peterzell et al. | ............... | 455/522 |
| 6,504,504 B1 * | 1/2003 | Tits et al. | ............... | 342/359 |
| 6,529,844 B1 * | 3/2003 | Kapetanic et al. | ............... | 702/85 |
| 7,218,896 B1 * | 5/2007 | Venkatesh | ............... | 455/73 |
| 7,711,334 B2 * | 5/2010 | Sivasubramaniam | ......... | 455/130 |
| 2002/0028666 A1 * | 3/2002 | Nakagawa et al. | ......... | 455/193.1 |
| 2002/0109498 A1 * | 8/2002 | Carlsson et al. | ............... | 324/95 |
| 2003/0214365 A1 * | 11/2003 | Adar et al. | ............... | 333/109 |
| 2004/0252786 A1 * | 12/2004 | McHenry | ............... | 375/297 |
| 2005/0122928 A1 * | 6/2005 | Vijayan et al. | ............... | 370/312 |
| 2005/0156585 A1 * | 7/2005 | Niedzwiecki | ............... | 324/76.21 |
| 2005/0200538 A1 * | 9/2005 | Tran | ............... | 343/702 |
| 2007/0018903 A1 * | 1/2007 | Mohamadi | ............... | 343/853 |
| 2007/0280185 A1 * | 12/2007 | McFarland et al. | ........... | 370/338 |
| 2009/0042526 A1 * | 2/2009 | Maulik et al. | ............... | 455/234.1 |
| 2009/0067351 A1 * | 3/2009 | Wiesbauer et al. | ............ | 370/277 |

FOREIGN PATENT DOCUMENTS

| | | | | |
|---|---|---|---|---|
| DE | 103 45 436 A1 | 5/2005 | ............... | H04B 1/40 |
| DE | 10 2004 026 168 A1 | 12/2005 | ............... | H04B 1/04 |
| EP | 0883250 A2 | 12/1998 | ............... | H04B 1/04 |

* cited by examiner

*Primary Examiner* — Chi Pham
*Assistant Examiner* — Shick Hom
(74) *Attorney, Agent, or Firm* — SpryIP, LLC

(57) ABSTRACT

A disclosed circuit arrangement may include a power detector. A multiplexer circuit may be coupled to the power detector. The multiplexer circuit may include at least two switching sections, one of the switching sections to pass a radio frequency (RF) signal generated based on a first modulation scheme to the power detector and another of the switching sections to pass an RF signal generated based on a second modulation scheme to the power detector.

31 Claims, 3 Drawing Sheets

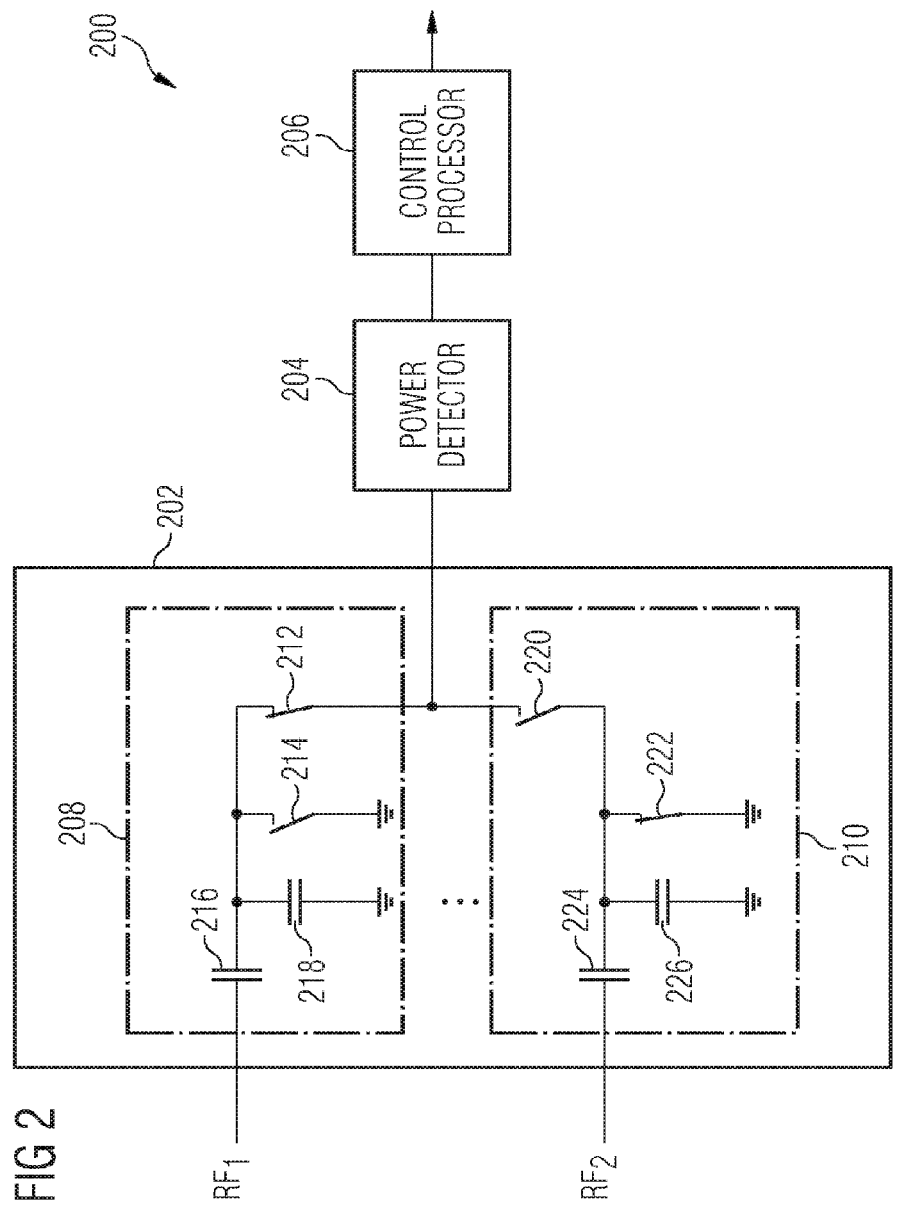

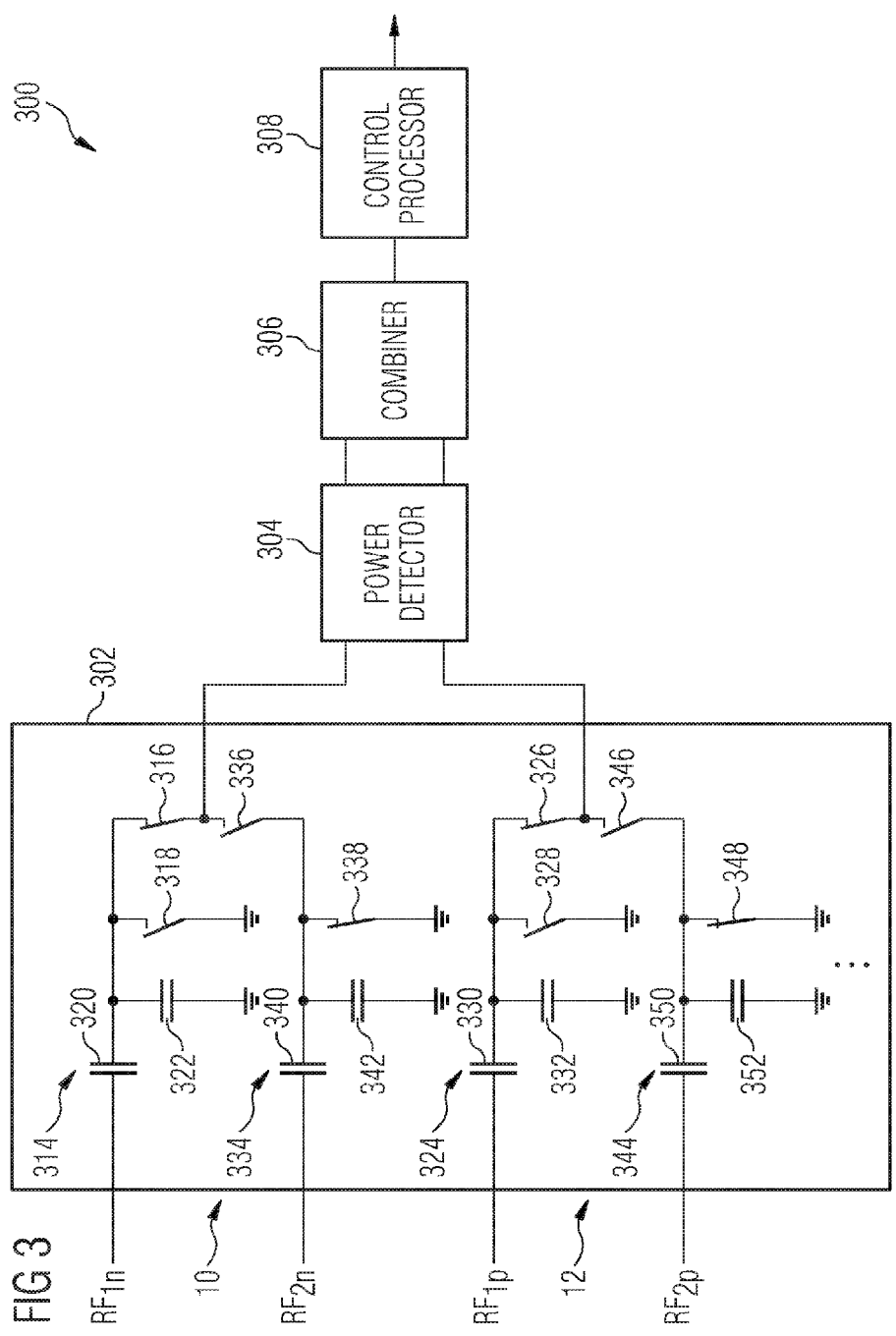

POWER DETECTOR RADIO FREQUENCY MULTIPLEXER

BACKGROUND

Wireless systems generally need to control radio frequency (RF) output to ensure transmitted signals are within acceptable regulated limits. For battery powered wireless systems and devices, controlling RF output may increase battery life. There are many other reasons to monitor and control RF output from wireless devices.

Power detectors are used in wireless systems to monitor the power of an RF signal that is output to an antenna. Generally, a power detector produces a direct current (DC) signal that is proportional to the power of the RF signal being sampled. A wireless system may use the DC signal as a measure of the power of the RF signal being transmitted, and thereby make adjustments in order to maintain the output power within system specifications.

Multi-band wireless systems are capable of receiving and transmitting over a wide frequency bandwidth, which may cover a plurality of wireless standards. For example, a multi-band wireless system may be configured to receive and transmit signals associated with the Global Standard for Mobile (GSM) digital system and the Advanced Mobile Phone System (AMPS) analog system. Such a multi-band wireless system generally employs multiple power detectors to monitor the power of the various RF signals output from the wireless system. The use of multiple power detectors in a multi-band wireless system adds to the overall number of components used to realize the system, which affects at least manufacturing costs, system size and may increase the complexity of the system.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

FIG. 2 illustrates a schematic circuit diagram including a power detector multiplexer coupled to a number of components associated with a wireless system. The illustrated power detector multiplexer is capable of receiving radio frequency (RF) signals associated with a plurality of wireless standards, and passing such received signals to a single power detector.

FIG. 3 illustrates a schematic circuit diagram including a power detector multiplexer coupled to a number of components associated with a wireless system. The illustrated power detector multiplexer is capable of receiving radio frequency (RF) signals, including differential RF signals, associated with a plurality of wireless standards, and passing such received signals to a single power detector.

DETAILED DESCRIPTION

Overview

Figure 1:
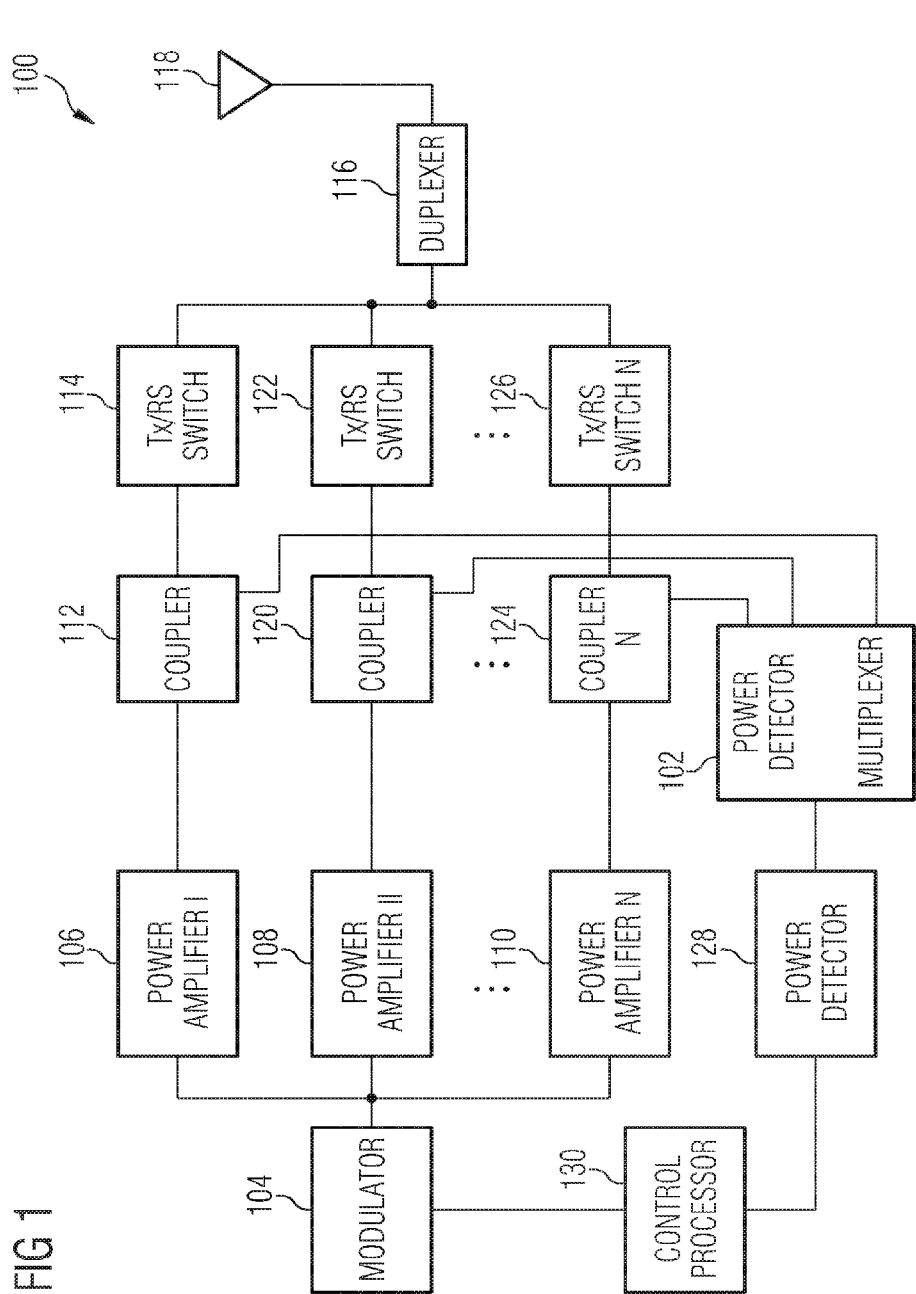
FIG. 1 is a block diagram illustrating components of a multi-band wireless system incorporating at least one exemplary implementation of a power detector multiplexer.

At least one implementation described herein substantially eliminates the use of multiple power detectors in a wireless system. Using fewer power detectors, or a single power detector, may reduce the size of wireless systems. Moreover, the use of fewer power detectors may reduce the costs of manufacturing wireless systems.

In one exemplary implementation, a power detector multiplexer is used in a wireless system that supports multiple wireless standards. Such standards may include, for example, the Global Standard for Mobile (GSM), Advanced Mobile Phone System (AMPS), code division multiple access (CDMA), and cdma2000. The power detector multiplexer may receive a plurality of radio frequency (RF) signals associated with diverse wireless standards. The power detector multiplexer is capable of selecting and routing each of one of the received plurality of RF signals to a common power detector. The power detector multiplexer may include direct current (DC) blocking capacitors and switches that select and route the RF signals received thereby.

In another exemplary implementation, a power detector multiplexer is used in a wireless system that supports multiple wireless standards and generates differential RF signals. The wireless standards supported by the wireless system may include, for example, GSM, AMPS, CDMA, and cdma2000. The power detector multiplexer may receive a plurality of radio (RF) signals associated with diverse wireless standards. The plurality of RF signals may include differential RF signals. Associated differential signals, such as those generated by a quadrature generator, generally have the same frequency, but one differential signal may be delayed one quarter cycle or period with respect to another differential signal in a differential signal pair. The power detector multiplexer is capable of selecting and routing each one of the received plurality of RF signals, or routing each differential signal pair, to a common power amplifier. The power detector multiplexer may include DC blocking capacitors and switches that select and route the RF signals received thereby.

Exemplary Arrangements

FIG. 1 is a block diagram illustrating components of a multi-band wireless system 100 incorporating at least one exemplary implementation of a power detector multiplexer 102. As will be discussed in further detail herein, the power detector multiplexer 102 is capable of receiving and processing RF signals sampled from a plurality of RF signal sources.

The multi-band wireless system 100 includes a modulator 104. The modulator 104 is capable of receiving voice or other data for modulation to a transmission frequency. If a signal received by the modulator 104 is for modulation at a first frequency band (e.g., for GSM), then the signal may be processed by a power amplifier I 106. Alternatively, if a signal received by the modulator 104 is for modulation at a second frequency band (e.g., for AMPS), then the signal may be processed by a power amplifier II 108. If the multi-band wireless system 100 is capable of handling more than two wireless standard modulation techniques, then additional power amplifiers N 110 may be implemented.

After a signal is amplified by the power amplifier I 106, the amplified signal is passed to a coupler 112. The coupler 112 passes a majority of the amplified signal to a transmit and receive switch 114. The transmit and receive switch 114 passes the amplified signal to a duplexer 116 that passes the signal to a multi-band antenna 118 for wireless transmission to a receiving device (not shown). Similarly, after a signal is amplified by the power amplifier II 108, the amplified signal is passed to a coupler 120. The coupler 120 passes a majority of the amplified signal to a transmit and receive switch 122. The transmit and receive switch 122 passes the amplified signal to the duplexer 116 that passes the signal to the multi-band antenna 118 for wireless transmission to a receiving device. If additional power amplifiers N 110 are implemented, then couplers N 124 and transmit and receive switches N 126 may be used in the multi-band wireless system 100.

Each coupler 112, 120 and 124 is interfaced with the power detector multiplexer 102. A portion of the signals passed through the couplers 112, 120 and 124 may be received by the power detector multiplexer 102 and processed thereby. An output of the power detector multiplexer 102 may be coupled to a power detector 128. The power detector 128 is capable of rectifying a received RF signal and converting the rectified RF signal to a DC signal that is proportional to the strength of an RF signal output from the power amplifiers 106, 108, and 110. The DC signal produced by the power detector 128 is input to a control microprocessor 130, or other similar control device. The control microprocessor 130 may signal a variable gain amplifier (VGA) or voltage variable attenuator (VVA), as the initial power sensing feedback stage within the modulator 110, to adjust a transmission power in accordance with predetermined transmission power requirements.

FIG. 2 illustrates a schematic circuit diagram 200 including a power detector multiplexer 202 coupled to a number of components associated with a wireless system. The illustrated power detector multiplexer 202 is capable of receiving RF signals associated with a plurality of wireless standards, and passing such received signals to a single power detector 204. The power detector 204 may be interfaced with a control processor 206. The control processor 206 may function in substantially the same manner as discussion in relation the control processor 130. The schematic circuit diagram 200 including the power detector multiplexer 202 may be used with a wireless system, such as the multi-band wireless system 100 illustrated in FIG. 1.

The power detector multiplexer 202 illustrated in FIG. 2 includes two switching sections 208 and 210. The switching section 208 is enabled and capable of passing an $RF_1$ signal when a switch 212 is in a closed state. An additional switch 214 is included in the switching section 208. When the switch 212 is in the closed state, the additional switch 214 is in an open state. Generally, the additional switch 214 is used to terminate signals to ground when the switch 212 is in the open state. To summarize, when the switch 212 is in the closed state, the switch 214 is toggled to the open state, and when the switch 212 is in the open state, the switch 214 is toggled to the closed state. The $RF_1$ signal may be the type generated based on a first wireless standard modulating scheme. The switching section 208 may also include capacitors 216 and 218. The capacitor 216 is used to block DC signals and the capacitor 218 may be generally considered a parasitic capacitance.

The switching section 210 is enabled and capable of passing an $RF_2$ signal when a switch 220 is in a closed state. An additional switch 222 is included in the switching section 210. When the switch 220 is in the closed state, the additional switch 222 is in an open state. Generally, the additional switch 222 is used to terminate signals to ground when the switch 220 is in the open state. To summarize, when the switch 220 is in the closed state, the switch 222 is toggled to the open state, and when the switch 220 is in the open state, the switch 222 is toggled to the closed state. The $RF_2$ signal may be the type generated based on a second wireless standard modulating scheme. The switching section 210 may also include capacitors 224 and 226. The capacitor 224 is used to block DC signals and the capacitor 226 may be generally considered a parasitic capacitance.

The switching sections 208 and 210 may be controlled by the control processor 206, or another alternative controlling mechanism. Operationally, the switching section 208 is enabled to pass an RF signal to the power detector 204 when the $RF_1$ signal is present at an input of the power detector multiplexer 202. This is made possible by toggling the switch 212 to a closed state and toggling the switch 214 to an open state. In conjunction with the toggling of switches 212 and 214, in the case of passing the $RF_1$ signal through the multiplexer 202, the switch 220 should be toggled to the open state and the switch 222 should be toggled to the closed state. The switching section 208 is generally not enabled to pass an RF signal if a signal is not present at an input thereof.

The switching section 210 is enabled to pass an RF signal to the power detector 204 when the $RF_2$ signal is present at an input of the power detector multiplexer 202. Because the switching section 210 operates in substantially the same manner as discussed in connection with the switching section 208, a detailed discussion of the switches 220 and 222 is not provided. The switching section 210 is generally not enabled to pass an RF signal if a signal is not present at an input thereof.

The design of the power detector multiplexer 202, in particular the ability to process and route at least two RF signals having diverse modulation properties (e.g., GSM and CDMA), substantially eliminates the need to use multiple power detectors in a wireless system. This may enable the manufacture of more compact wireless systems. Although the power detector multiplexer 202 illustrated in FIG. 2 is shown having the capacity to process two RF signals, additional switching sections may be implemented to enable the processing of N RF signals.

In addition, although the power detector multiplexer 202 is shown as receiving two RF signals, the power detector multiplexer 202 may also receive on one input an RF signal and on the other input a reference signal. This reference signal may be used to calibrate the power detector 204. In some implementations, the reference signal is a sinusoidal signal in the GHz range. However, the reference signal may also be in the MHz range. One exemplary system that makes use of such a reference to the signal is an ultra wideband (UWB) radio.

FIG. 3 illustrates a schematic circuit diagram 300 including a power detector multiplexer 202 coupled to a number of components associated with a wireless system. The illustrated power detector multiplexer 302 is capable of receiving differential RF signals associated with a plurality of wireless standards, and passing such received signals to a single power detector 304. The power detector 304 may be interfaced with a combiner 306 that is coupled to a control processor 308. The combiner 306 is capable of combining differential RF signals output from the power detector multiplexer 302. The control processor 308 may function in substantially the same manner as discussed in relation the control processor 130 and 206. The schematic circuit diagram 300 including the power detector multiplexer 302 may be used with a wireless system, such as the multi-band wireless system 100 illustrated in FIG. 1.

The power detector multiplexer 302 illustrated in FIG. 3 operates in a similar manner to the power detector multiplexer 202, with the exception being that the power detector multiplexer 302 is capable of processing differential RF signals. Unlike single RF signals, differential RF signals are generally comprised of two RF signals (in-phase and quadrature phase signals) that need to be summed or combined before transmission. The power detector multiplexer 302 makes it possible to use a single power detector in a wireless system that makes use of differential RF signals.

The power detector multiplexer 302 has a first differential RF signal input signal section 310 and a second differential RF signal input section 312. The first section 310 allows either an I (in-phase) signal ($RF_{1n}$) associated with a first differential signal pair or an I signal ($RF_{2n}$) associated with a second differential signal pair to pass to the power detector 304. The second section 312 allows either a Q (quadrature phase) signal ($RF_{1p}$) associated with the first differential signal pair or a Q signal ($RF_{2p}$) associated with the second differential signal pair to pass to the power detector 304. Although differential I and Q carrier signals are discussed as being processed by the power detector multiplexer 302, other combinable RF signals may also be processed by the multiplexer 302.

The first differential RF signal input signal section 310 includes a first switching section 314. The first switching section 314 is enabled and capable of passing an $RF_{1n}$ signal when a switch 316 is in a closed state. An additional switch 318 is included in the switching section 314. When the switch 316 is in the closed state, the additional switch 318 is in an open state. Generally, the additional switch 318 is used to terminate signals to ground when the switch 316 is in the open state. To summarize, when the switch 316 is in the closed state, the switch 318 is toggled to the open state, and when the switch 316 is in the open state, the switch 318 is toggled to the closed state. The $RF_{1n}$ signal may be the type generated based on a first wireless standard modulating scheme that makes use of differentially modulated signals. The first switching section 314 may also include capacitors 320 and 322. The capacitor 320 is used to block DC signals and the capacitor 322 may be generally considered a parasitic capacitance.

The second differential RF signal input signal section 312 includes a first switching section 324 that operates in conjunction with the first switching section 314. The first switching section 324 is enabled and capable of passing an $RF_{1p}$ signal when a switch 326 is in a closed state. An additional switch 328 is included in the switching section 324. When the switch 326 is in the closed state, the additional switch 328 is in an open state. Generally, the additional switch 328 is used to terminate signals to ground when the switch 326 is in the open state. To summarize, when the switch 326 is in the closed state, the switch 328 is toggled to the open state, and when the switch 326 is in the open state, the switch 328 is toggled to the closed state. The $RF_{1p}$ signal may be the type generated based on a first wireless standard modulating scheme that makes use of differentially modulated signals. The first switching section 324 may also include capacitors 330 and 332. The capacitor 330 is used to block DC signals and the capacitor 332 may be generally considered a parasitic capacitance.

The switching sections 314 and 324 function cooperatively to pass differentially paired signals, such as differential signals $RF_{1n}$ and $RF_{1p}$, to the power detector 304. In one implementation, the switching sections 314 and 324 may be controlled by the control processor 206, or another alternative controlling mechanism. After the differential signals $RF_{1n}$ and $RF_{1p}$ are processed by the power detector 304, the signals are combined by the combiner 306 and output to the control processor 308 for subsequent transmission via an antenna.

The first differential RF signal input signal section 310 includes a second switching section 334. The second switching section 334 is enabled and capable of passing an $RF2_n$ signal when a switch 336 is in a closed state. An additional switch 338 is included in the switching section 334. When the switch 336 is in the closed state, the additional switch 338 is in an open state. Generally, the additional switch 338 is used to terminate signals to ground when the switch 336 is in the open state. To summarize, when the switch 336 is in the closed state, the switch 338 is toggled to the open state, and when the switch 336 is in the open state, the switch 338 is toggled to the closed state. The $RF2_n$ signal may be the type generated based on a second wireless standard modulating scheme that makes use of differentially modulated signals. The switching section 334 may also include capacitors 340 and 342. The capacitor 340 is used to block DC signals and the capacitor 342 may be generally considered a parasitic capacitance.

The second differential RF signal input signal section 312 includes a second switching section 344 that operates in conjunction with the second switching section 334. The second switching section 344 is enabled and capable of passing an $RF_{2p}$ signal when a switch 346 is in a closed state. An additional switch 348 is included in the switching section 344. When the switch 346 is in the closed state, the additional switch 348 is in an open state. Generally, the additional switch 348 is used to terminate signals to ground when the switch 346 is in the open state. To summarize, when the switch 346 is in the closed state, the switch 348 is toggled to the open state, and when the switch 346 is in the open state, the switch 348 is toggled to the closed state. The $RF_{2p}$ signal may be the type generated based on a second wireless standard modulating scheme that makes use of differentially modulated signals. The switching section 344 may also include capacitors 350 and 352. The capacitor 350 is used to block DC signals and the capacitor 352 may be generally considered a parasitic capacitance.

The switching sections 334 and 344 function cooperatively to pass differentially paired signals, such as differential signals $RF2_n$ and $RF_{2p}$, to the power detector 304. In one implementation, the switching sections 334 and 344 may be controlled by the control processor 308, or another alternative controlling mechanism. After the differential signals $RF_{1n}$ and $RF_{1p}$ are processed by the power detector 304, the signals are combined by the combiner 306 and output to the control processor 308 for subsequent transmission via an antenna.

The design of the power detector multiplexer 302, in particular the ability to process and route at least two differentially paired RF signals having diverse modulation properties (e.g., GSM and CDMA), substantially eliminates the need to use multiple power detectors in a wireless system. This may enable the manufacture of more compact wireless systems. Although the power detector multiplexer 302 illustrated in FIG. 3 is shown having the capacity to process two differentially paired RF signals, additional switching sections may be implemented to enable the processing of N differentially paired RF signals.

The exemplary power detector multiplexers 202 and 302 may be employed by a computing device, such as a computer that includes wireless functionality, a wireless phone, a wireless base station, a network can access device, (e.g., a broadband access device), a personal digital assistant (PDA), and so on. Such computing devices may include integrated circuits (ICs) that have one or more of the power detector multiplexers 202 and 302 integrated therein. As those skilled in the art appreciate, such ICs may include processors, memories, amplifiers, receivers, transceivers, and so forth.

The technology shown in FIGS. 1-3 is merely illustrative of a select few components that may be used to design the illustrated implementations. Those of ordinary skill in the art appreciate many other component combinations may be used to develop the devices illustrated in the figures.

Conclusion

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

What is claimed is:

1. A circuit arrangement, comprising:
   a power detector; and
   a multiplexer circuit coupled to the power detector, the multiplexer circuit including at least two switching sections, one of the switching sections to pass a radio frequency (RF) signal generated based on a first modulation scheme to the power detector and another of the switching sections to pass an RF signal generated based on a second modulation scheme to the power detector, wherein the power detector is common to the at least two switching sections.

2. The circuit according to claim 1, wherein each of the at least two switching sections includes a switch that enables RF signals to pass to the power detector, the switch of each of the at least two switching sections to pass RF signals to the power detector when in a closed state.

3. The circuit according to claim 2, wherein the switch of each of the at least two switching sections prevents RF signals to pass to the power detector when in an open state.

4. The circuit according to claim 1, wherein each of the at least two switching sections includes a switch that enables RF signals to pass to ground, the switch of each of the at least two switching sections to pass RF signals to ground when in a closed state.

5. The circuit according to claim 4, wherein the switch of each of the at least two switching sections prevents RF signals to pass to ground when in an open state.

6. The circuit according to claim 1, wherein each of the at least two switching sections includes a switch that enables RF signals to pass to the power detector and another switch that enables RF signals to pass to ground, the switches of each of the at least two switching sections toggled oppositely when the multiplexer circuit is actively processing any RF signal.

7. The circuit according to claim 1, wherein each of the at least two switching sections includes two switches in parallel, one of the switches coupled to ground and another of the switches coupled to an input of the power detector.

8. The circuit according to claim 7, wherein each of the at least two switching sections includes a capacitor, each capacitor of the at least two switching sections coupled to the at least two switches of a respective one of the at least two switching sections.

9. A circuit arrangement, comprising:
   a power detector; and
   a multiplexer circuit coupled to the power detector, the multiplexer circuit including at least four switching sections, two of the switching sections to pass differential radio frequency (RF) signals generated based on a first modulation scheme to the power detector and another two of the switching sections to pass differential RF signals generated based on a second modulation scheme to the power detector.

10. The circuit according to claim 9, wherein each of the at least four switching sections includes a switch that enables RF signals to pass to the power detector, the switch of each of the at least four switching sections to pass RF signals to the power detector when in a closed state.

11. The circuit according to claim 10, wherein the switch of each of the at least four switching sections prevents RF signals to pass to the power detector when in an open state.

12. The circuit according to claim 9, wherein each of the at least four switching sections includes a switch that enables RF signals to pass to ground, the switch of each of the at least four switching sections to pass RF signals to ground when in a closed state.

13. The circuit according to claim 12, wherein the switch of each of the at least four switching sections prevents RF signals to pass to ground when in an open state.

14. The circuit according to claim 9, wherein each of the at least four switching sections includes two switches in parallel, one of the switches coupled to ground and another of the switches coupled to an input of the power detector.

15. A wireless system, comprising:
    an integrated circuit having a multiplexer circuit, the multiplexer circuit including at least two switching sections, one of the switching sections to pass a radio frequency (RF) signal generated based on a first modulation scheme and another of the switching sections to pass an RF signal generated based on a second modulation scheme,
    wherein the multiplexer circuit of the integrated circuit is coupled to a single power detector.

16. A method, comprising:
    receiving at least two radio frequency (RF) signals, one of the at least two received RF signals generated based on a first modulation scheme and another of the at least two received RF signals generated based on a second modulation scheme;
    processing the at least two RF signals by way of a multiplexer circuit, the multiplexer circuit including at least two switching sections, one of the switching sections to pass RF signals generated based on a first modulation scheme and another of the switching sections to pass RF signals generated based on a second modulation scheme; and
    detecting signal attributes associated with each of the at least two RF signals by way of a common power detector.

17. The method according to claim 16, wherein the received at least two RF signals include differential RF signals.

18. The method according to claim 16, wherein each of the at least two switching sections of the multiplexer circuit includes a switch that enables RF signals to pass to the common power detector, the switch of each of the at least two switching sections to pass RF signals to the common power detector when in a closed state.

19. A circuit arrangement, comprising:
    a power detector; and
    a multiplexer circuit coupled to the power detector, the multiplexer circuit including at least two switching sections, one of the switching sections to pass a radio frequency (RF) signal generated based on a first modulation scheme to the power detector and another of the switching sections to pass a reference signal.

20. The circuit arrangement according to claim 19, wherein the circuit arrangement is employed in an ultra wideband system.

21. A circuit arrangement, comprising:
    a power detector; and
    a multiplexer circuit coupled to the power detector, the multiplexer circuit including at least two switching sections, one of the switching sections to pass a signal generated based on a modulation scheme to the power detector and another of the switching sections to pass a signal to calibrate the power detector.

22. The circuit according to claim 21, wherein each of the at least two switching sections includes a switch that enables signals to pass to the power detector, the switch of each of the at least two switching sections to pass signals to the power detector when in a closed state.

23. The circuit according to claim 22, wherein the switch of each of the at least two switching sections prevents signals to pass to the power detector when in an open state.

24. The circuit according to claim 21, wherein each of the at least two switching sections includes a switch that enables signals to pass to ground, the switch of each of the at least two switching sections to pass signals to ground when in a closed state.

25. The circuit according to claim 23, wherein the switch of each of the at least two switching sections prevents signals to pass to ground when in an open state.

26. The circuit according to claim 21, wherein each of the at least two switching sections includes a switch that enables signals to pass to the power detector and another switch that enables signals to pass to ground, the switches of each of the at least two switching sections toggled oppositely when the multiplexer circuit is actively processing any signal.

27. The circuit according to claim 21, wherein each of the at least two switching sections including two switches in parallel, one of the switches coupled to ground and another of the switches coupled to an input of the power detector.

28. The circuit according to claim 27, wherein each of the at least two switching sections includes a capacitor, each capacitor of the at least two switching sections coupled to the at least two switches of a respective one of the at least two switching sections.

29. A wireless system, comprising:
an integrated circuit having a multiplexer circuit, the multiplexer circuit including at least two switching sections, one of the switching sections to pass a signal generated based on a modulation scheme and another of the switching sections to pass a calibration signal,
wherein the multiplexer circuit of the integrated circuit is coupled to a single power detector.

30. The wireless system according to claim 29, wherein the multiplexer circuit of the integrated circuit is coupled to a single power detector.

31. The wireless system according to claim 30, wherein the calibration signal is to calibrate the single power detector.

* * * * *